United States Patent [19]
Nitayama et al.

[11] Patent Number: 5,905,279
[45] Date of Patent: *May 18, 1999

[54] LOW RESISTANT TRENCH FILL FOR A SEMICONDUCTOR DEVICE

[75] Inventors: Akihiro Nitayama; Hiroyoshi Tanimoto, both of Kawasaki, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/629,597

[22] Filed: Apr. 9, 1996

[51] Int. Cl.$^6$ .......................... H01L 27/108; H01L 29/76
[52] U.S. Cl. .......................... 257/301; 257/302; 257/303; 257/304; 257/306; 257/372
[58] Field of Search .................... 257/301, 302, 257/303, 304, 306, 372; 437/60, 190, 195

[56] References Cited

U.S. PATENT DOCUMENTS

| | | | |
|---|---|---|---|
| 4,444,620 | 4/1984 | Kovacs et al. | 156/657 |
| 4,509,990 | 4/1985 | Vasudev | 148/1.5 |
| 4,584,025 | 4/1986 | Takaoka et al. | 148/1.5 |
| 4,659,392 | 4/1987 | Vasudev | 148/1.5 |
| 4,716,548 | 12/1987 | Mochizuki | 365/149 |
| 4,753,895 | 6/1988 | Mayer et al. | 437/21 |
| 4,816,893 | 3/1989 | Mayer et al. | 357/42 |
| 4,824,793 | 4/1989 | Richardson et al. | 437/47 |
| 4,826,300 | 5/1989 | Efron et al. | 350/342 |
| 4,849,371 | 7/1989 | Hansen et al. | 437/82 |
| 4,853,342 | 8/1989 | Taka et al. | 437/31 |
| 4,910,709 | 3/1990 | Dhong et al. | 365/149 |
| 4,915,746 | 4/1990 | Welsch | 148/4 |
| 4,916,524 | 4/1990 | Teng et al. | 357/23.6 |
| 4,942,554 | 7/1990 | Kirchner et al. | 365/149 |
| 4,988,637 | 1/1991 | Dhong et al. | 437/52 |
| 5,116,768 | 5/1992 | Kawamura | 437/21 |
| 5,138,420 | 8/1992 | Komori et al. | 357/42 |
| 5,168,073 | 12/1992 | Gonzalez et al. | 437/47 |
| 5,168,366 | 12/1992 | Sasaki | 257/297 |
| 5,185,294 | 2/1993 | Lam et al. | 437/193 |
| 5,192,703 | 3/1993 | Lee et al. | 437/52 |
| 5,262,662 | 11/1993 | Gonzalez et al. | 257/307 |
| 5,292,678 | 3/1994 | Dhong et al. | 437/50 |
| 5,308,783 | 5/1994 | Krautschneider et al. | 437/52 |
| 5,312,768 | 5/1994 | Gonzalez | 437/40 |
| 5,336,629 | 8/1994 | Dhong et al. | 437/52 |
| 5,376,566 | 12/1994 | Gonzalez | 437/35 |
| 5,380,673 | 1/1995 | Yang et al. | 437/47 |
| 5,413,950 | 5/1995 | Chen et al. | 437/52 |
| 5,422,294 | 6/1995 | Noble, Jr. | 437/52 |
| 5,488,242 | 1/1996 | Sunouchi et al. | 257/301 |
| 5,563,433 | 10/1996 | Nagata et al. | 257/301 |
| 5,614,431 | 3/1997 | DeBrosse | 437/52 |

FOREIGN PATENT DOCUMENTS

| | | | |
|---|---|---|---|
| 6-21387 | 1/1994 | Japan | 257/303 |
| 6-104398 | 5/1994 | Japan . | |

OTHER PUBLICATIONS

L. Nesbit et al., "A 0.6 $\mu m^2$ 256Mb Trench DRAM Cell With Self–Aligned BuriEd STrap (BEST)", 1993 IEEE, pp. 627–630.

Patent Abstract of Japan; Publication No. 6–104398, published Apr. 15, 1994 for "Semiconductor Storage Device and Manufacture Thereof".

*Primary Examiner*—Valencia Martin Wallace
*Attorney, Agent, or Firm*—Banner & Witcoff, Ltd.

[57] ABSTRACT

A memory cell having a low storage node resistance and a method of manufacturing the same are provided. A trench type memory cell, in addition to storage node polysilicon, has other conductive material embedded in the storage node. Conductive material may be one of WSi, TiSi, W, Ti, and TiN. The additional conductive material provides a low storage node resistance which facilitates the realization of 256 Mbit memory cells and beyond.

28 Claims, 15 Drawing Sheets

LUMPED RC MODEL

DISTRIBUTED RC MODEL

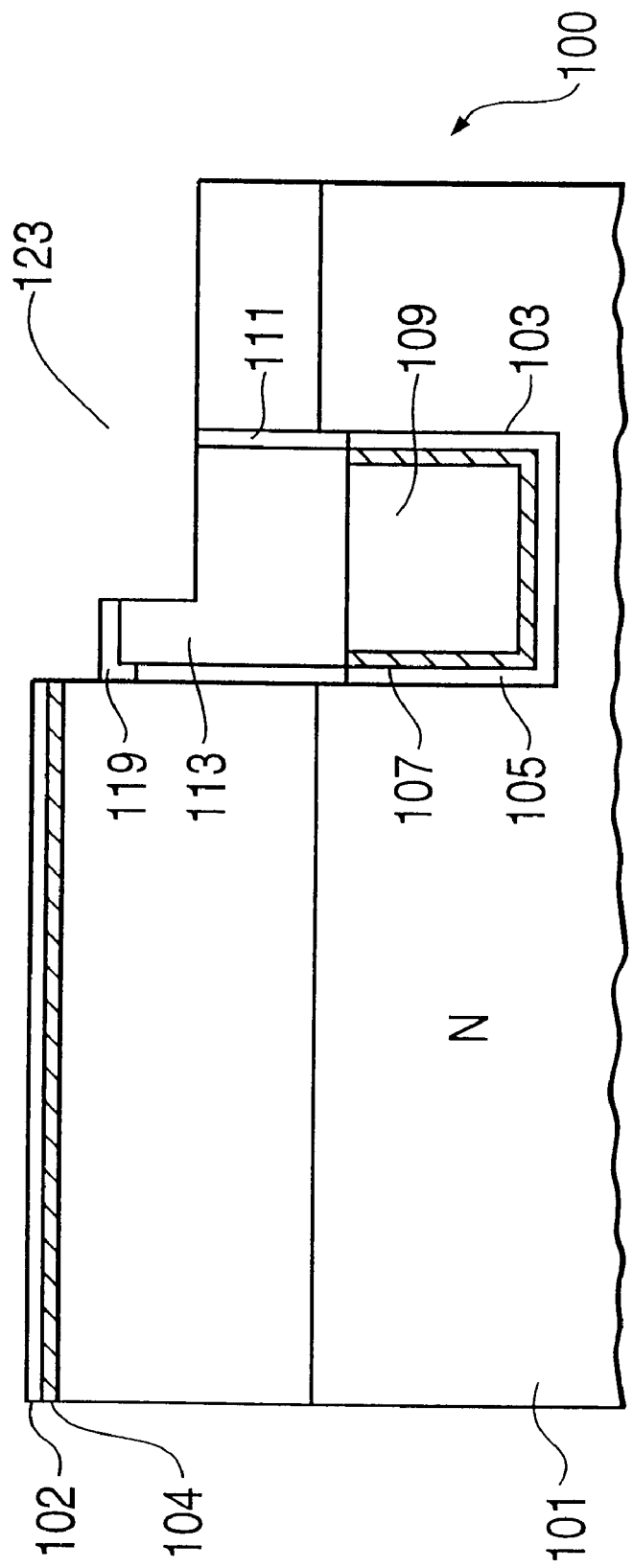

LOW RESISTANT TRENCH FILL FOR A SEMICONDUCTOR DEVICE

FIELD OF INVENTION

The invention generally relates to a trench for a semiconductor device and, more particularly, to a trench fill structure in which conductive material (other than polysilicon) is embedded in the trench to decrease the resistance of the trench fill.

BACKGROUND OF INVENTION

Very large scale integration semiconductor technologies have substantially increased the circuit density on a chip. Miniaturization of devices built in and on semiconductor substrates has led to ultra large scale integration with minimum device dimensions less than a micrometer and more than a million transistors on a chip. With the improved integration, circuit elements such as memory cells experience electrical limitations resulting from their downsizing.

It is desirable to increase the integration density of memory cells on a memory chip by making the MOS transfer transistor and the storage capacitor which comprise a memory cell smaller. This has been particularly desirable with dynamic random access memory (DRAM) storage cells. However, the storage capacitor must be large enough to store sufficient charge for ensuring that data is correctly read from and written to the memory cell. Trench capacitors have been developed to increase the capacitance of the storage capacitor while permitting the integration density of memory cells to be increased.

FIGS 1A and 1B show a memory cell described in Nesbit et al., A 0.6 $\mu m^2$ 256 Mb Trench DRAM Cell With Self-Aligned BuriEd STrap (BEST), IEDM 93-627-630, the contents of which are incorporated herein. Specifically, FIG. 1A illustrates a top-down view of a DRAM cell having a self-aligned buried strap and FIG. 1B is a cross-sectional view taken along I–I' of FIG. 1A. DRAM cell 50 includes a trench capacitor 55 and a transfer gate 60. Trench capacitor 55 includes a first $N^+$ polysilicon fill 65, a second $N^+$ polysilicon fill 67, and a collar oxide 71. Transfer gate 60 includes N-type source/drain regions 73 and 74 formed in a P-well 75 and a polysilicon gate 77 insulatively spaced from the channel between source/drain regions 73 and 74. A bit line contact 79 electrically connects source/drain region 73 to bit line 81. A shallow trench isolation (STI) arrangement 80 electrically isolates DRAM cell 50 from an adjacent memory cell and passing word line 92. A diffusion region 83 is formed to electrically connect third polysilicon fill 69 and source/drain region 74 of MOS transfer gate 60 by outdiffusing dopants from highly doped polysilicon fill in the storage trench into the P-well 75. Diffusion region 83 and third polysilicon fill 69 constitute a buried strap for connecting trench capacitor 55 to transfer gate 60.

One of the problems is that the resistance of the storage node (Rsn) poly becomes a much greater factor as technological advances are made to accommodate 256 Mbit, 1 GBit and larger DRAM cells. Consequently, with the shrinking design groundrule of high capacity DRAMs, the signal delay (tsd) in the sensing operation performed by a sense amplifier coupled to the bit line associated with a memory cell becomes increasingly large, thereby increasing memory cell access time to undesirable levels. For example, in a simulation of sensing delay versus storage node resistance for a 256 Mbit trench DRAM with a self-aligned BuriEd STrap (BEST) structure, it was found that the storage node resistance Rsn was 60 kOhms and the sensing signal delay tsn was 5.5 nanoseconds (ns). In the simulation for a 1 Gbit DRAM, the storage node resistance Rsn was 130 kOhms and the sensing signal delay tsn was 10 ns. The simulation was performed using both a lumped RC model and a distributed RC model, respectively shown in FIGS. 2A and 2B, with the following relations: Vto (transfer gate voltage)=0.75 volts@ Vpwell=0 volts; WL Vpp=3.5 volts; BL Vblh=1.8 volts; and "1" is data read. Using SPICE (circuit simulator) with the distributed and lumped RC models, the sensing delay (i.e., the delay time from the transfer gate being turned on to 90% signal output at the sense amplifier) was simulated. The results of the simulation are graphically represented in FIG. 2C which shows sensing delay vs. storage node resistance. The DRAM storage node resistance substantially increases between a 256 Mbit DRAM and a 1 Gbit DRAM. For a 1 Gbit DRAM, the diameter of the trench decreases as the design rule (feature size) decreases. However, the depth of the trench does not decrease so that a reasonable amount of storage capacitance (Cs) can be maintained. Thus, the deep trench polysilicon becomes much narrower, resulting in a storage node resistance substantially higher than the 256 Mbit DRAM.

SUMMARY OF THE INVENTION

The present invention overcomes the aforementioned disadvantages by providing a trench type DRAM cell having additional conductive material embedded in the storage node to suppress resistance. This is particularly useful for trench type DRAM cells of 256 Mbit and beyond to suppress storage node resistance.

A method of forming a coupled capacitor and transistor according to an illustrative embodiment of the present invention includes the steps of forming a trench in a semiconductor substrate, forming a first conductive region by filling the trench with at least first and second conductive materials, the first conductive material being a first impurity-doped conductive material and the second conductive material being a material other than polysilicon, etching back the first conductive region to a first level within the trench, forming an insulating layer on a sidewall of the portion of the trench opened by the etching back of the first conductive region, forming a second conductive region by filling the remainder of the trench with the first conductive material, and etching back the insulating layer and the second conductive region to a second level within the trench. The method further includes the steps of forming a third conductive region in the portion of the trench opened by the etching back of the insulating layer and the second conductive region, etching back the third conductive region to a third level within the trench, outdiffusing impurities from at least one of the conductive regions to the semiconductor substrate, and forming a source/drain region of the transistor adjacent to an intersection of the trench and the surface of the semiconductor substrate, the outdiffused impurities comprising a buried strap for electrically connecting the first and second conductive materials in the trench to the source/drain region.

An illustrative memory cell structure according to the present invention includes a semiconductor substrate, a trench formed in the semiconductor substrate, a first trench fill including a first conductive region of at least first and second conductive materials, the first conductive material being a first impurity-doped conductive material and the second conductive material being a material other than polysilicon, an insulating layer formed on a sidewall of the portion of the trench above the first trench fill, a second trench fill formed on the first conductive region and including a second conductive region, a third trench fill formed on the second conductive region and the insulating layer and including a third conductive region, a transistor having a source/drain region adjacent to an intersection of the trench and the surface of the semiconductor substrate, and a buried strap, formed by outdiffusing impurities from at least one of the conductive regions to the semiconductor substrate, for electrically connecting the first and second conductive materials in the trench to the source/drain region.

BRIEF DESCRIPTION OF THE DRAWINGS

The present invention will now be described in more detail with reference to preferred embodiments of the invention, given only by way of example, and illustrated in the accompanying drawings in which:

FIGS. 3A–3J illustrate a manufacturing method according to a first embodiment of the present invention.

DETAILED DESCRIPTION

The present invention is discussed below with reference to a trench type DRAM cell. However, the present invention generally may be applied to fills for any type of memory cell or semiconductor device. For example, the present invention may be applied to other structures and applications including, but not limited to, a poly stud for a bit line contact in a memory cell array.

Figure 1A:
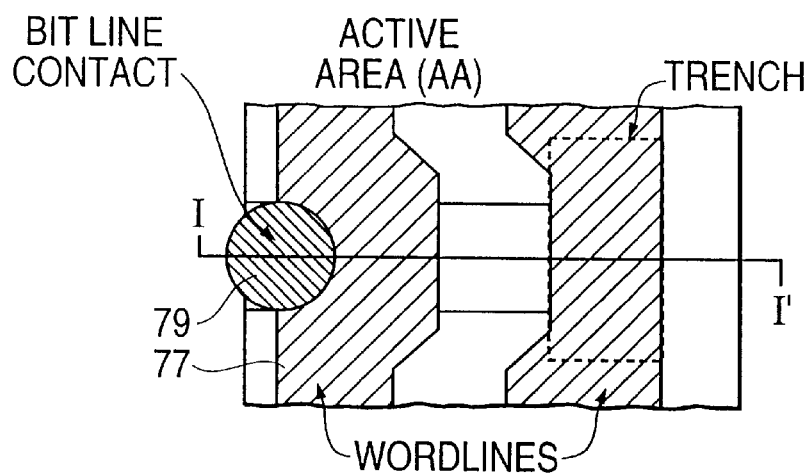
FIGS. 1A and 1B are top-down and cross-sectional views, respectively, of a DRAM cell with a self-aligned buried strap.
Figure 1B:
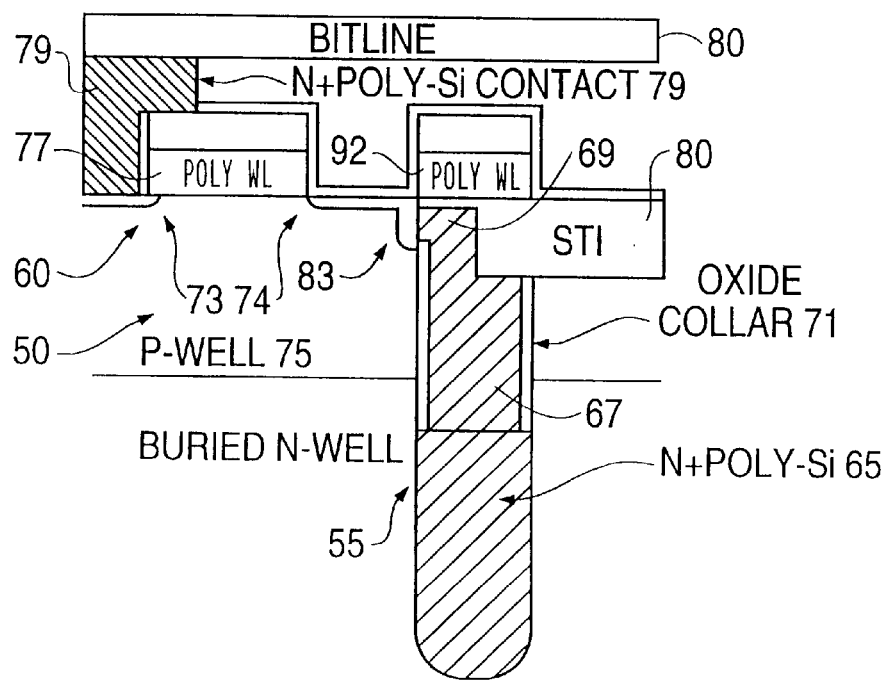
Figure 2A:
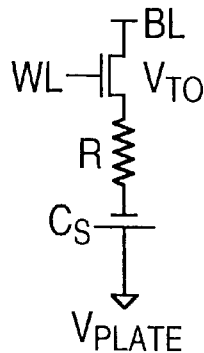
FIGS. 2A and 2B show the models used to perform a simulated test using the conventional semiconductor structure.
Figure 2B:
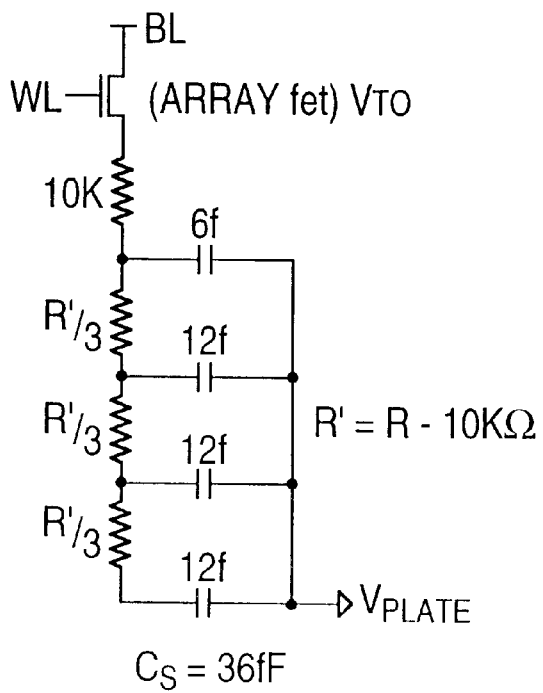
Figure 2C:
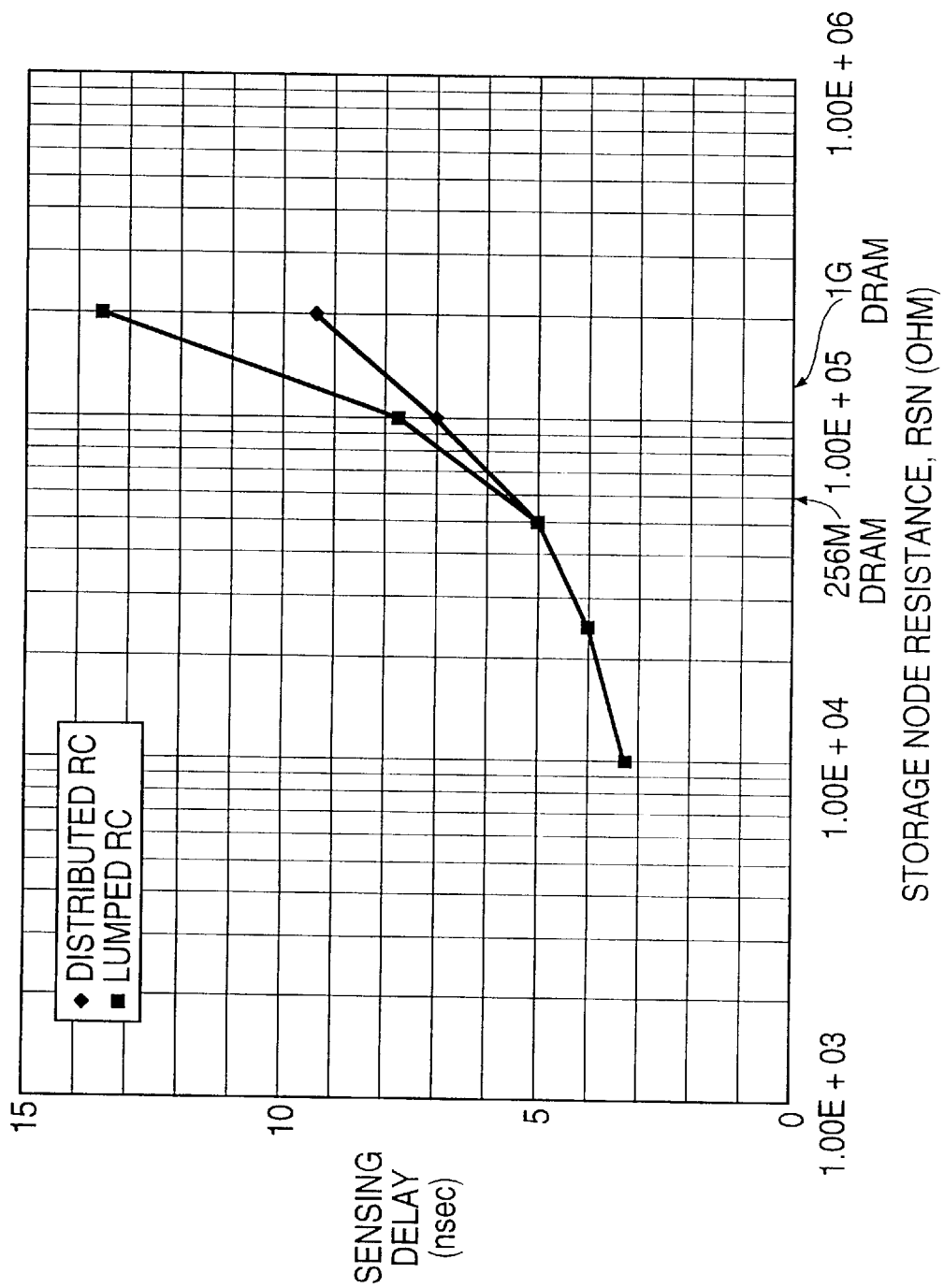
FIG. 2C is a graphical representation of signal delays versus storage node resistance for a simulated test using the conventional semiconductor structure.
Figure 3A:
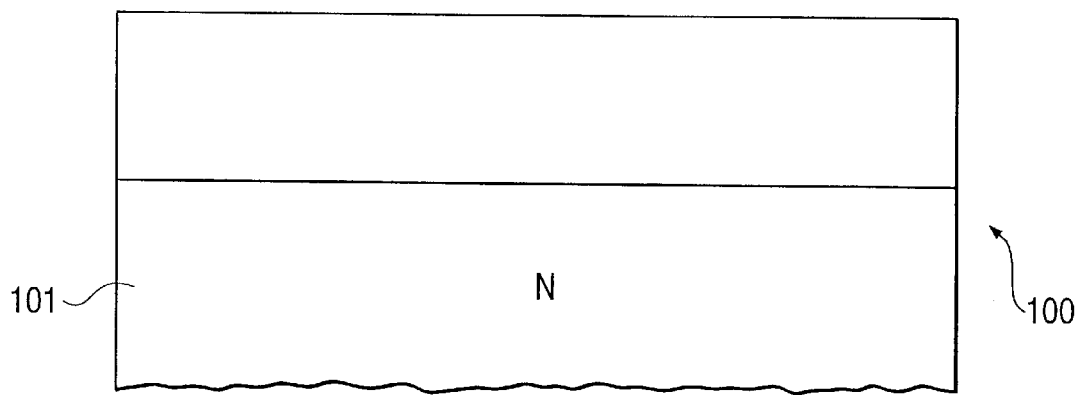
Figure 3B:
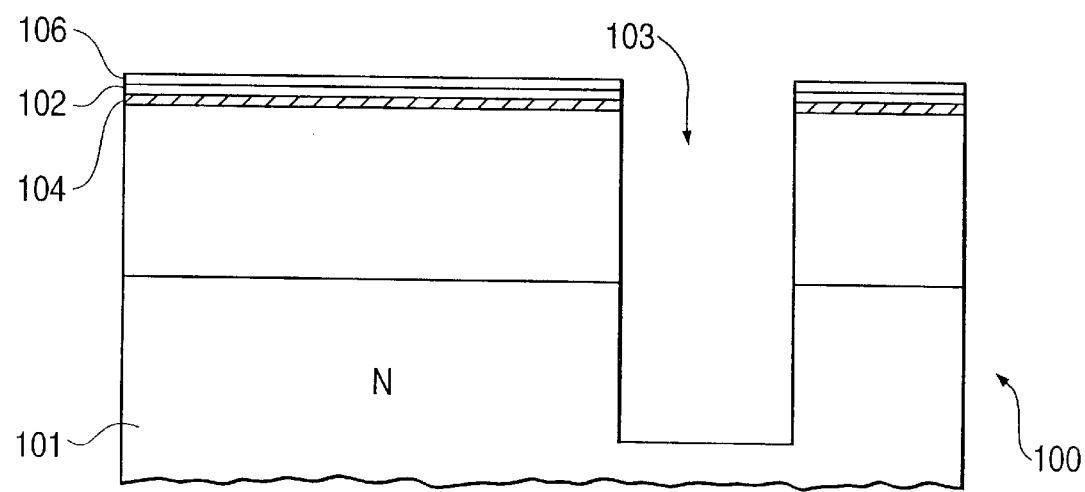

FIGS. 3A–3J illustrate a method in accordance with a first embodiment of the present invention. FIG. 3A shows a substrate 100 having a buried N-well 101. As shown in FIG. 3B, a silicon nitride layer 102 of about 0.2 micrometers ($\mu$m) is formed by chemical vapor deposition, for example, on the surface of a thin oxide layer 104 (e.g., about 10 nanometers) which is thermally grown on semiconductor substrate 100. An oxide layer 106 is formed by PECVD (plasma enhanced chemical vapor deposition) on the SiN layer 102. The oxide layer 106 serves as a pad oxide and suppresses erosion of the SiN layer 102 which can occur during a DT (deep trench) RIE etch.

Figure 3C:
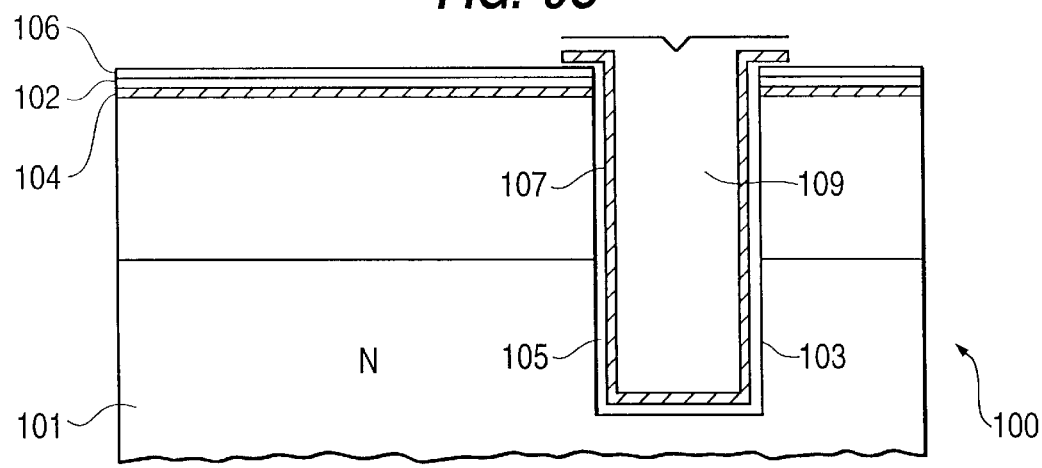
Figure 3D:
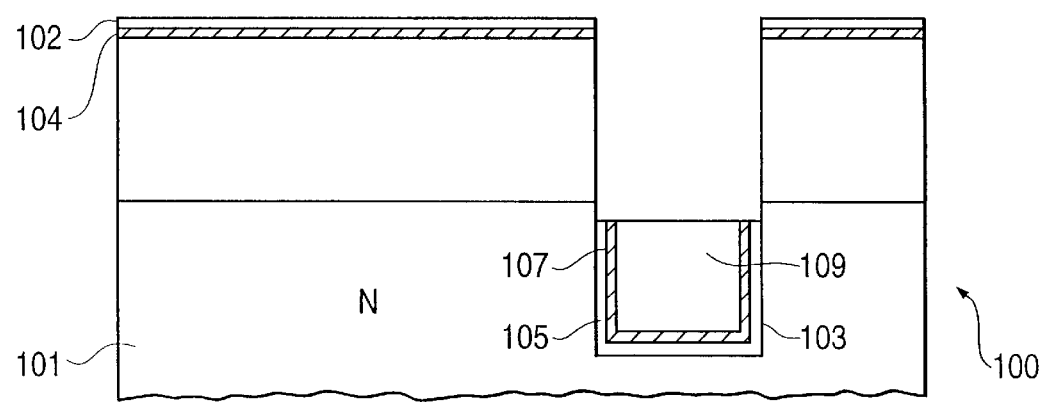
Figure 3E:
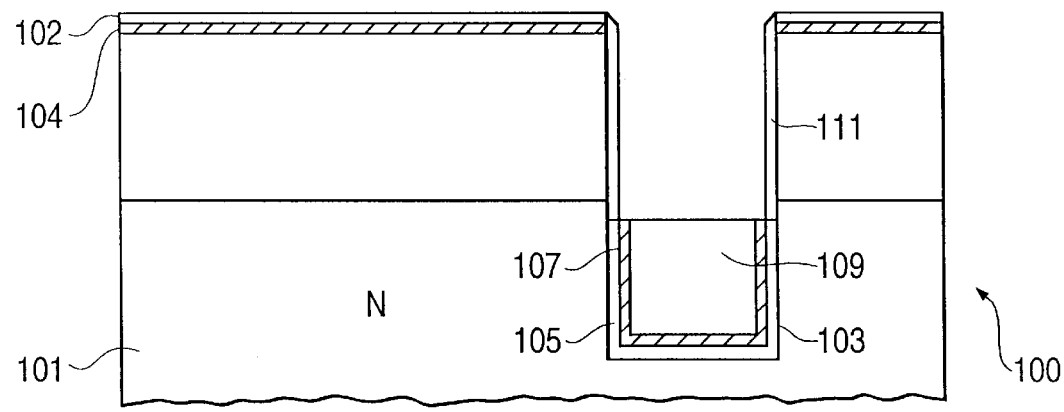

Oxide layer 104, silicon nitride layer 102, and oxide layer 106 are patterned and etched to provide a mask for etching a trench 103. Trench 103 is etched using an anisotropic etching process to a depth of about 8 micrometers as shown in FIG. 3B. After storage node trench 103 is etched, an oxidized nitride (ON) storage node dielectric (not shown) is formed in trench 103. After the dielectric is formed, trench 103 is filled by a first conductive region of a stacked-layer structure which includes a first layer 105 of an impurity-doped first conductive material (such as thin $N^+$-type polycrystalline silicon), a second layer 107 of a second conductive material other than polysilicon such as WSi, TiSi, W, Ti, or TiN, and a third layer 109 of an impurity-doped third conductive material (such as $N^+$-type polycrystalline silicon) as shown in FIG. 3C. The first conductive region is then etched back to a first level within trench 103 using an anisotropic etch process to form a first trench fill as shown in FIG. 3D. During the etch back or recess etch, the oxide layer 106 is also removed. The level of first trench fill is about 1.0 micrometer ($\mu$m) below the surface of semiconductor substrate 100. A collar oxide 111 is then formed on the sidewall of the portion of trench 103 opened by etching back the first conductive region using LPCVD or PECVD TEOS as shown in FIG. 3E.

Figure 3F:
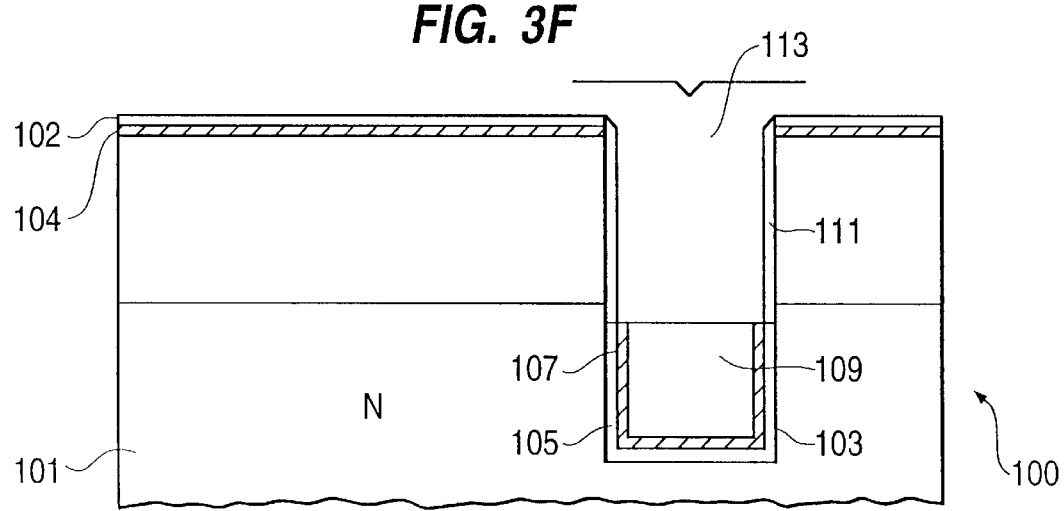
Figure 3G:
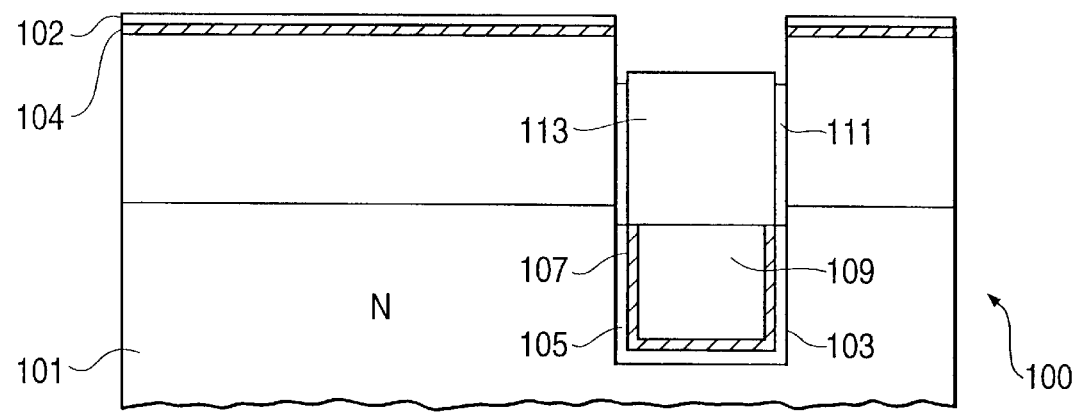

A second conductive region is formed by filling in the remainder of trench 103 with a conductive material 113 as shown in FIG. 3F. The conductive material 113 may be, for example, $N^+$-type polycrystalline silicon or undoped polycrystalline silicon and may be formed by chemical vapor deposition. Thereafter, the oxide collar 111 and the conductive material 113 are etched as shown in FIG. 3G.

Figure 3H:
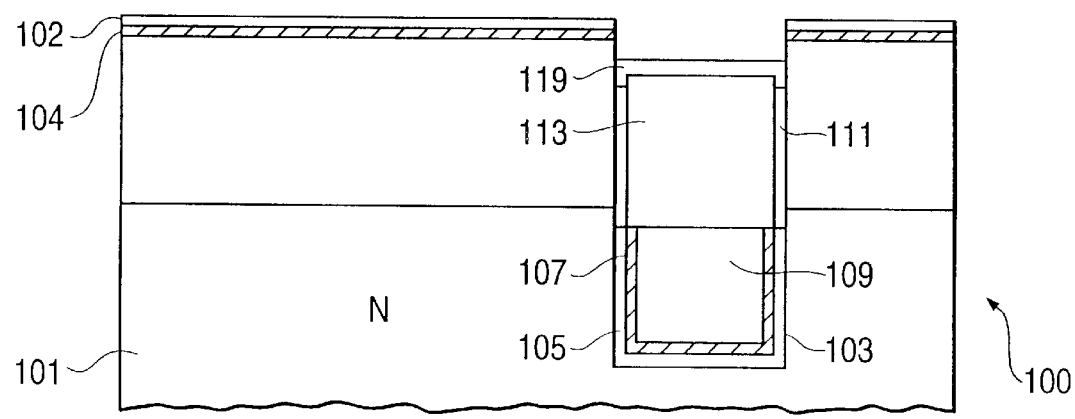
Figure 3J:
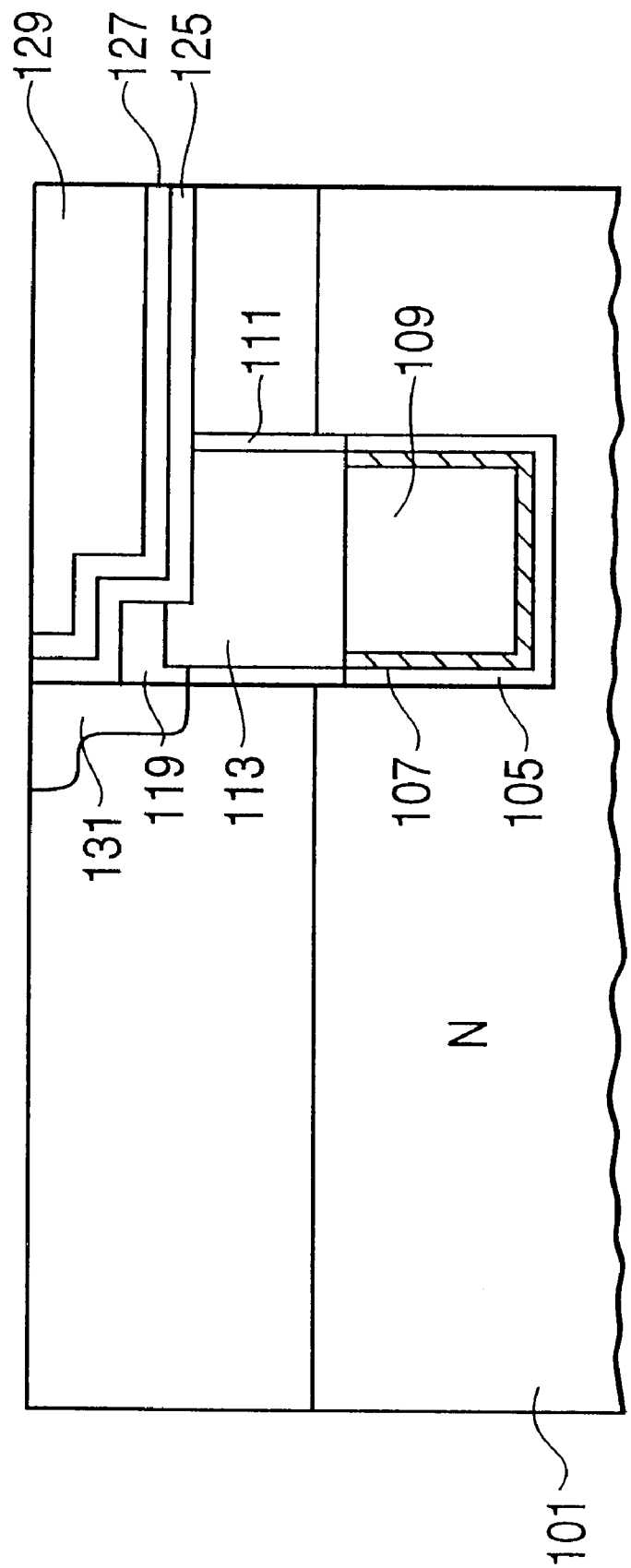

The portion of trench 103 opened by the etching back of oxide collar 111 and the conductive material 113 is then filled by depositing polysilicon 119 using chemical vapor deposition, for example. The polysilicon 119 is then etched back using reactive ion etching, for example, to form a third trench fill as shown in FIG. 3H. The polysilicon 119 is preferably etched back to about 0.05 micrometer ($\mu$m) below the surface of semiconductor substrate 100 as determined by tolerable resistance of the buried strap (e.g., less than 10 kOhm) which is much less than the storage node resistance, and the recess etch controllability. At this juncture, the polysilicon 119 forms a strap along the entire perimeter of the trench 103.

Next, the structure in FIG. 3H undergoes a shallow trench isolation process. With reference to FIG. 3I, a reactive ion etch is performed to provide shallow trench 123 for shallow trench isolation. In general, shallow trench isolation is used to isolate discrete memory cell devices to prevent interference therebetween. Accordingly, a shallow trench such as shallow trench 123 is formed between adjacent deep trench configurations to ensure that they operate independently.

Shallow trench 123 is then filled in to ensure isolation from adjacent trench structures. For example, with reference to FIG. 3J, an oxide lining 125 may be formed over the layer 119 and the interior surface of shallow trench 123 by, for example, thermal oxidation. A nitride lining 127 may then be formed over oxide lining 125 by, for example, CVD. The oxide and nitride linings 125, 127 serve to isolate collar oxide 111 from oxidant, and thereby suppress dislocation and stress. Finally, shallow trench 123 may be filled according to techniques known in the art. For example, an oxide 129 may be deposited to fill in shallow trench 123.

Other shallow trench isolation techniques may be used such as the technique described in U.S. application Ser. No. 08/351,161 entitled "Shallow Trench Isolation with Deep Trench Cap", which is incorporated herein by reference thereto.

During the complete DRAM fabrication process, impurities from one or a combination of the conductive regions within the trench are outdiffused to form strap portion 131, e.g., an $n^+$buried strap. A gate insulator may then be formed on the planar surface, and gate material may be deposited and patterned to form gate electrodes. Using the gate electrodes as masks, source/drain regions may be formed by ion implantation. Accordingly, transfer gates coupled to trench capacitors are realized. Interconnections between devices and metallization to the output terminals are formed using techniques known in the art. Then, the bit line process and back end of line process follow. According to this embodiment, the resistance of the first trench fill is decreased. For example in a 256 Mbit DRAM, the total depth of the trench is 8 µm and the depth of the second fill 113 is only about 1 µm. The second conductive material enhances the conductance of the storage node throughout a substantial portion of the other 7 µm depth of the trench. As a result, the aforedescribed structure substantially reduces the storage node resistance. Assuming a buried strap resistance of 10 kOhm, using the above embodiment, the storage node resistance and sensing delay respectively decrease from 60 kOhm to 16 kOhm and from 5.5 ns to 4 ns for a 256 Mbit DRAM, and from 130 kOhm to 25 kOhm and 10 ns to 6 ns for a 1 Gbit DRAM.

Figure 4A:
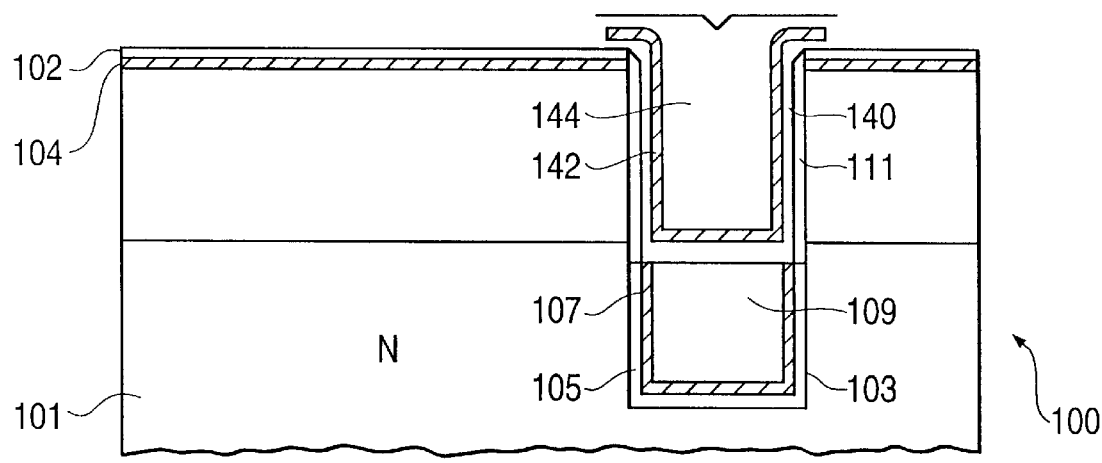
FIGS. 4A–4C illustrate a manufacturing method according to a second embodiment of the present invention.
Figure 4B:
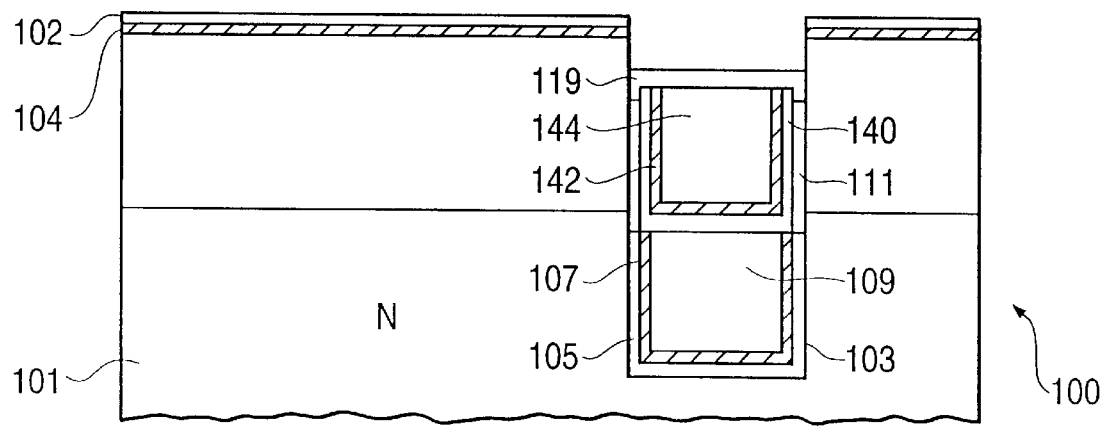
Figure 4C:
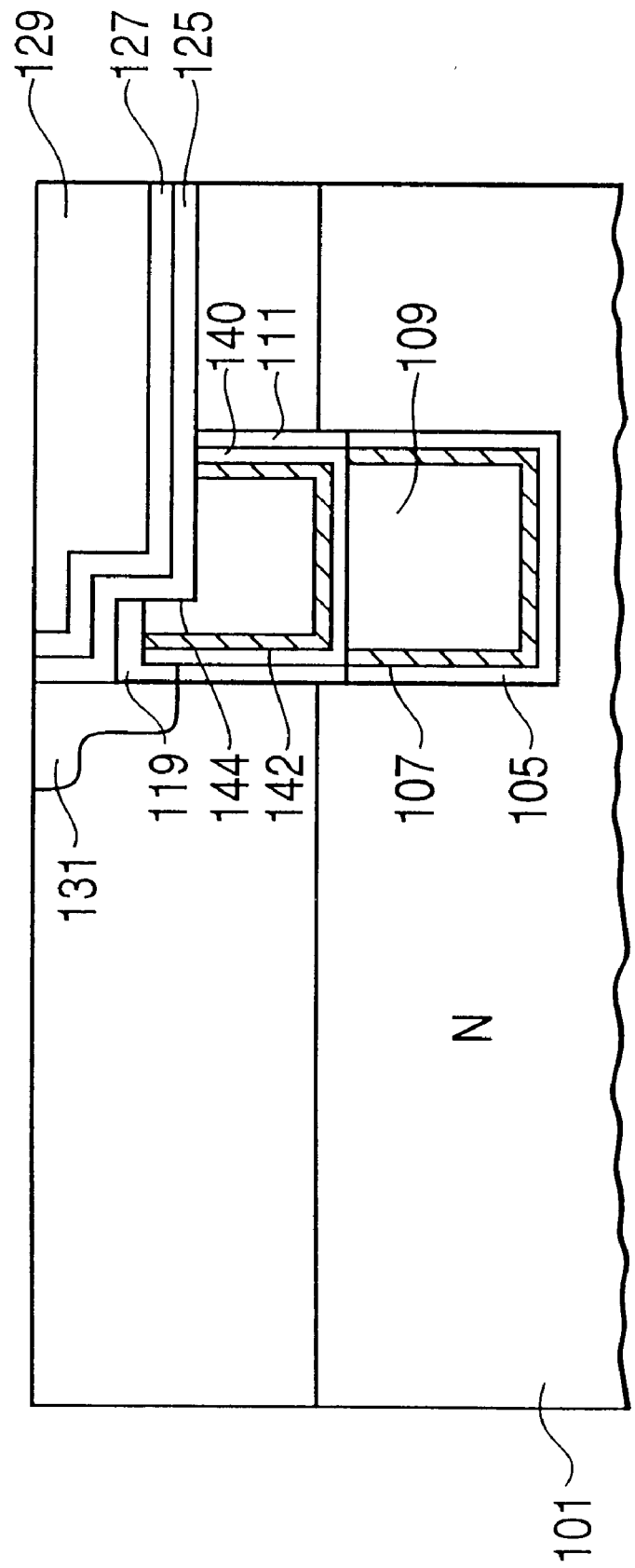

FIGS. 4A–4C illustrate a method in accordance with a second embodiment of the present invention.

According to the second embodiment, the steps to realize the structure in FIG. 3E are carried out. Next, trench 103 is filled by a second conductive region of a stacked-layer structure which includes a first layer 140 of an impurity-doped first conductive material (such as thin N$^+$-type polycrystalline silicon), a second layer 142 of a second conductive material such as WSi, TiSi, W, Ti, or TiN, and a third layer 144 of an impurity-doped third conductive material (such as N$^+$-type polycrystalline silicon) as shown in FIG. 4A. The non-polysilicon conductive material in the first conductive region can be different from the non-polysilicon conductive material in the second conductive region.

The second conductive region and the oxide collar 111 are then etched back to a second level within trench 103 to form a second trench fill insulated from the semiconductor substrate by oxide collar 111 similar to that shown in FIG. 3G. The depth of the buried strap to be formed in a subsequent process step is defined by this controlled etch-back of the conductive region and oxide collar 111. The second trench fill is etched back to about 0.1 µm below the surface of semiconductor substrate 100.

The portion of trench 103 opened by the etching back of oxide collar 111 and the conductive region is then filled by depositing polysilicon 119 using chemical vapor deposition, for example. The polysilicon 119 is then etched back using reactive ion etching, for example, to form a third trench fill as shown in FIG. 4B. The polysilicon 119 is preferably etched back to about 0.05 micrometer (µm) below the surface of semiconductor substrate 100 as determined by the tolerable resistance of the buried strap, and by the recess etch controllability. At this juncture, the polysilicon 119 forms a strap along the entire perimeter of the trench 103.

The process described above with respect to shallow trench isolation described above is performed on the structure shown in FIG. 4B and the resulting structure is shown in FIG. 4C. This embodiment decreases the resistance of both the first and second trench fills. Thus, the second embodiment can reduce the storage resistance more than the first embodiment. For example, if the buried strap resistance is 10 kOhm, for a 256 Mbit DRAM, the storage node resistance is reduced from 60 kOhm to 11 kOhm and the sensing delay is reduced from 5.5 ns to 3.5 ns. For a 1 Gbit DRAM, the storage node resistance is reduced from 130 kOhm to 12 kOhm and the sensing delay is reduced from 10 ns to 3.5 ns.

Figure 5A:
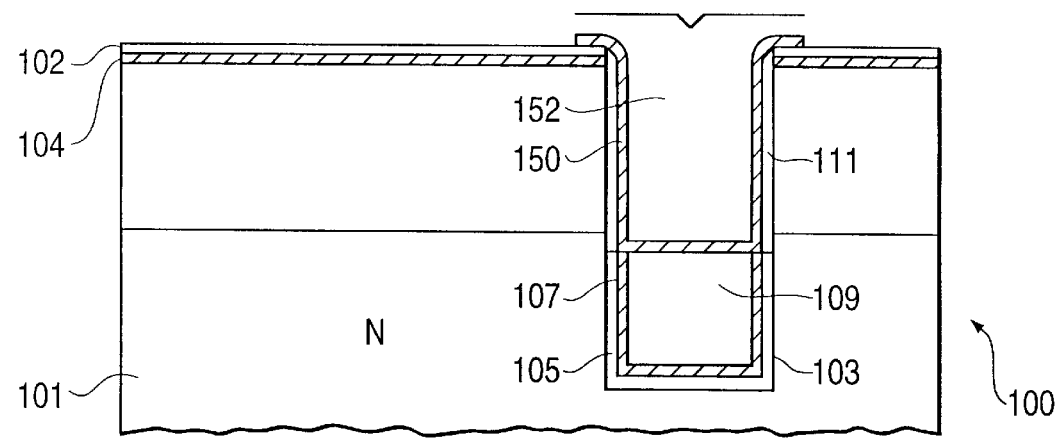
FIGS. 5A–5C illustrate a manufacturing method according to a third embodiment of the present invention.
Figure 5B:
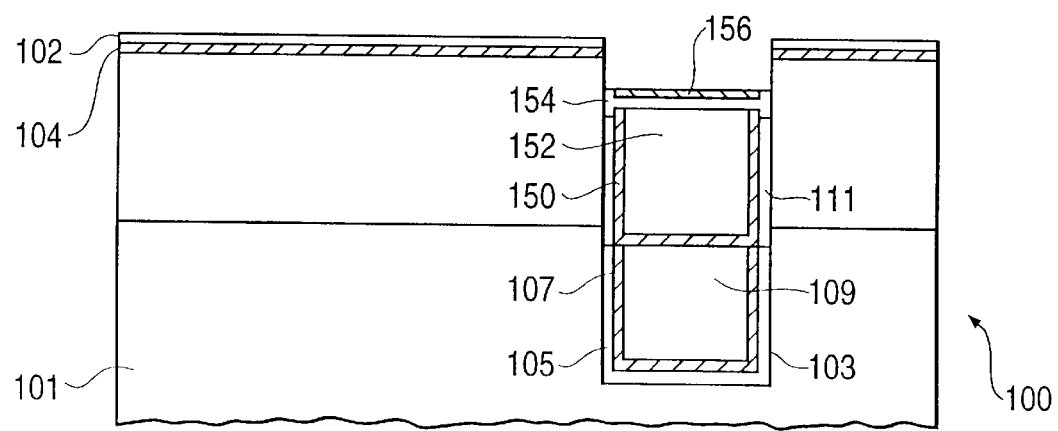
Figure 5C:
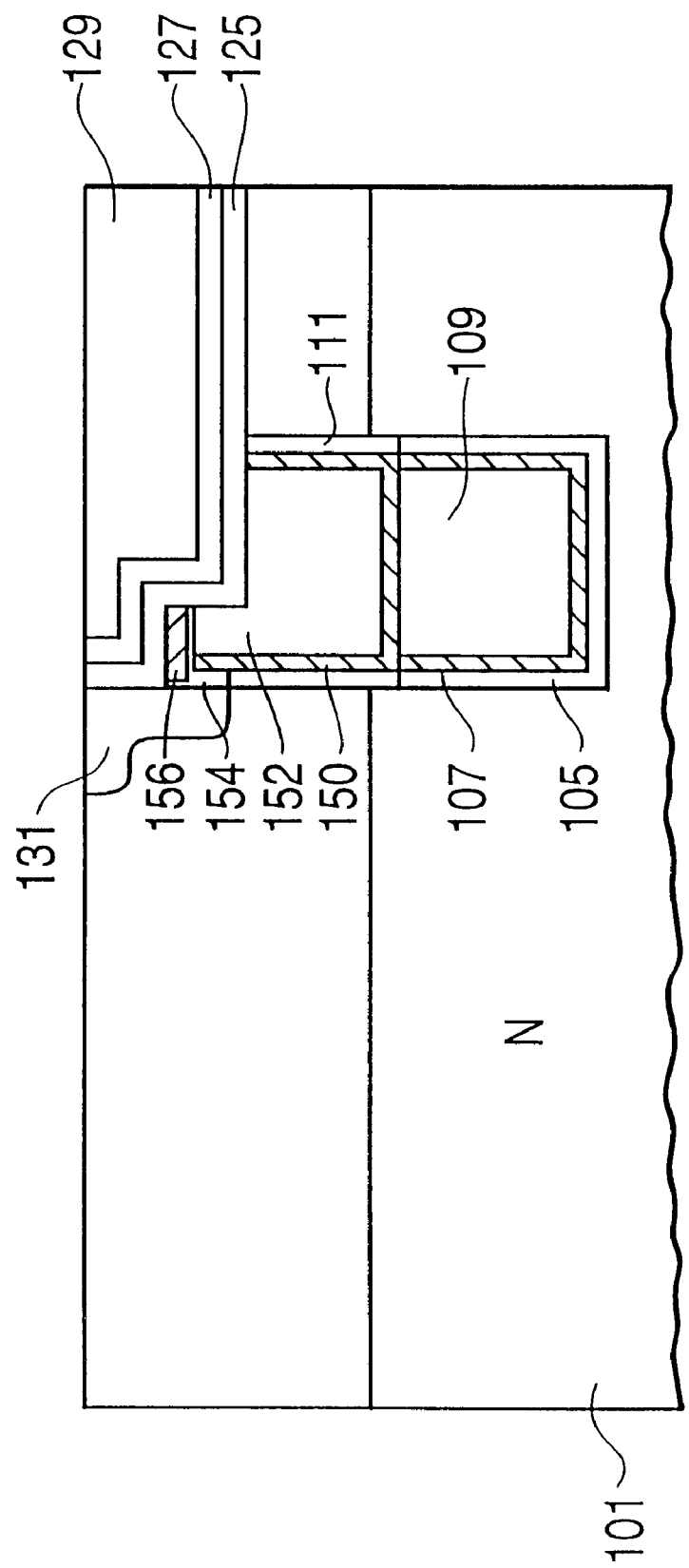

FIGS. 5A–5C illustrate a method in accordance with a third embodiment of the present invention.

According to the third embodiment, the steps to realize the structure in FIG. 3E are carried out. Next, trench 103 is filled by a second conductive region of a stacked-layer structure which includes a first layer 150 of a first conductive material (preferably WSi, but may be one of TiSi, W, Ti and TiN), and a second layer 152 of an impurity-doped second conductive material (such as N$^+$-type polycrystalline silicon) as shown in FIG. 5A.

The second conductive region and the oxide collar 111 are then etched back to a second level within trench 103 to form a second trench fill insulated from the semiconductor substrate by oxide collar 111 similar to that shown in FIGS. 3G and 4B. The depth of the buried strap to be formed in a subsequent process step is defined by this controlled etch-back of the conductive region and oxide collar 111. The second trench fill is etched back to about 0.1 micrometer (µm) below the surface of semiconductor substrate 100.

The portion of trench 103 opened by the etching back of oxide collar 111 and the second conductive region is then filled by depositing a third conductive region of a stacked-layer structure which includes a first layer 154 of a first conductive material (preferably TiSi, but may be one of WSi, W, Ti, and TiN), and a second layer 156 of a conductive material such as polysilicon as shown in FIG. 5B. The third conductive region is then etched back using reactive ion etching, for example, to form a third trench fill as shown in FIG. 5B. The third conductive region is preferably etched back to about 0.05 micrometer (µm) below the surface of semiconductor substrate 100 as determined by the tolerable resistance of the buried strap, and by the recess etch controllability. At this juncture, the third conductive region forms a strap connection along the entire perimeter of the trench 103.

The process described above with respect to shallow trench isolation described above is performed on the structure shown in FIG. 5B and the resulting structure is shown in FIG. 5C. In addition to decreasing the resistance of the first and second trench fills, the third embodiment also decreases the resistance of the third trench fill and the buried strap. Thus, this embodiment reduces the storage node resistance more than the first and second embodiments. For example, if the buried strap resistance is 200 kOhm, for a 256 Mbit DRAM, the storage node resistance is reduced from 60 kOhm to 1 kOhm and the sensing delay is reduced from 5.5 ns to 3 ns. For a 1 Gbit DRAM, the storage node resistance is reduced from 130 kOhm to 2 kOhm and the sensing delay is reduced from 10 ns to 3 ns.

Figure 6A:
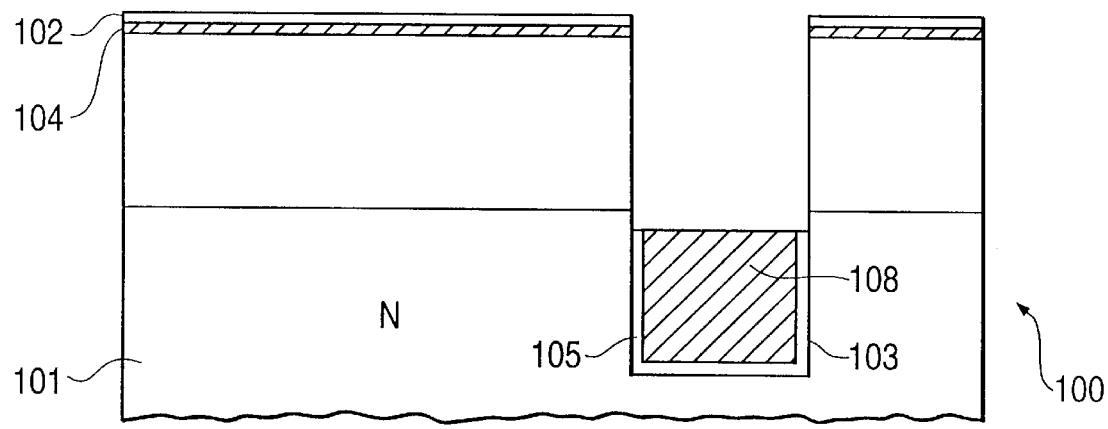
FIGS. 6A and 6B illustrate a manufacturing method according to a fourth embodiment of the present invention.
Figure 6B:
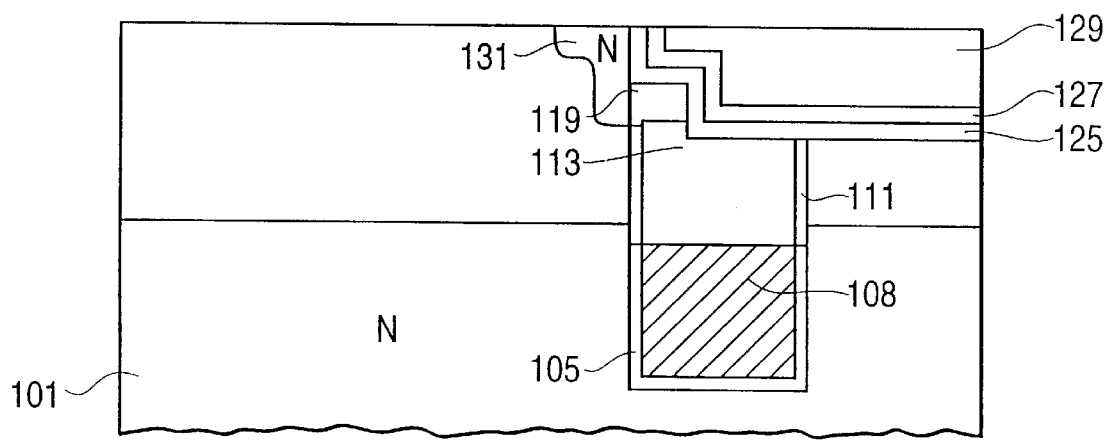

FIGS. 6A and 6B illustrate a method in accordance with a fourth embodiment of the present invention.

According to the fourth embodiment, the steps to realize the structure in FIG. 3B are carried out. Next, trench 103 is filled by a first conductive region of a stacked-layer structure which includes a first layer 105 of an impurity-doped first conductive material (such as N$^+$-type polycrystalline silicon) and a second layer 108 of a second conductive material (preferably WSi, but may be one of TiSi, W, Ti and TiN). The first conductive region is then etched back to a first level within trench 103 using an anisotropic etch process to form a first trench fill as shown in FIG. 6A. Next, the steps described above and shown in FIGS. 3E–3J are carried out on the structure shown in FIG. 6A resulting in the structure shown in FIG. 6B.

Figure 7:
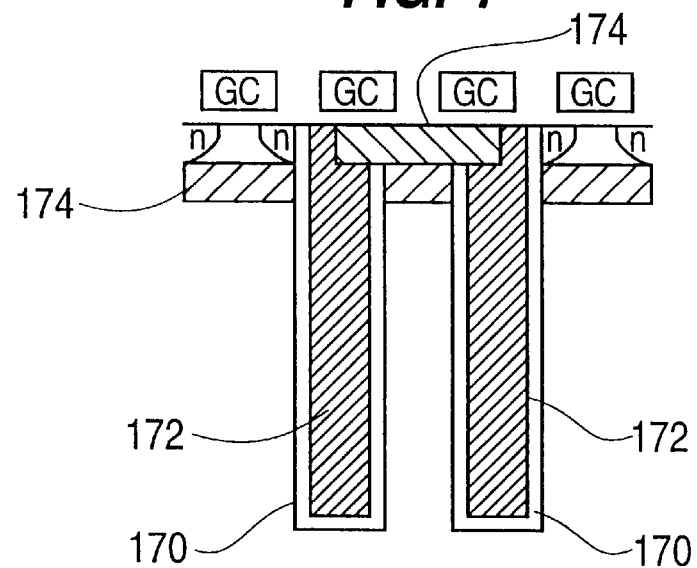
FIG. 7 is an illustration of a resulting structure according to a fifth embodiment of the present invention.

FIG. 7 illustrates the structure realized according to a fifth embodiment where a conductive material (preferably W, but may be one of TiSi, Ti, TiN, and WSi) is used in the storage node of an SOI (silicon-on-insulator) trench-type DRAM cell. A similar memory structure can be found in Japanese Patent Publication No. 6104398, to Hieda published Apr. 15, 1994 and entitled "Semiconductor Storage Device and Manufacture Thereof. In FIG. 7, the structure shown includes trenches with a conductive region of a stacked-layer structure which includes a first layer 170 of an impurity-doped first conductive material (such as $N^+$-type polycrystalline silicon) and a second layer 172 of a second conductive material (preferably W, but may be one of TiSi, W, Ti and TiN). Also shown in the SOI trench-type DRAM cell structure is an oxide 174, preferably $SiO_2$, and gate conductors GC. This structure can be realized by manufacturing process steps including filling the trenches with the conductive regions, etching the conductive regions back and forming the remainder of SOI structure as known in the art.

Figure 8:
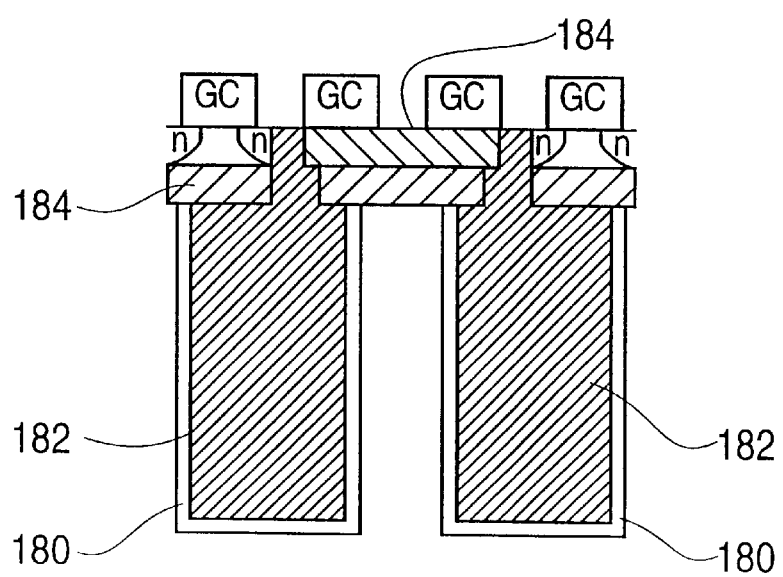
FIG. 8 is an illustration of a resulting structure according to a sixth embodiment of the present invention.

FIG. 8 illustrates the structure realized according to a sixth embodiment where a conductive material (preferably W, but may be one of TiSi, Ti, TiN, and WSi) is used in the storage node of a wafer bonding SOI trench-type DRAM cell. In FIG. 8, the structure shown includes trenches with a conductive region of a stacked-layer structure which includes a first layer 180 of an impurity-doped first conductive material (such as $N^+$-type polycrystalline silicon) and a second layer 182 of a second conductive material (preferably W, but may be one of TiSi, W, Ti and TiN). Also shown in the wafer bonding SOI trench-type DRAM cell structure is an oxide 184, preferably $SiO_2$, and gate conductors GC. This structure can be realized by manufacturing process steps including fill the trenches with the conductive regions, etching the conductive regions back and forming the remainder of wafer bonding SOI structure as known in the art.

While particular embodiments of the present invention have been described and illustrated, it should be understood that the invention is not limited thereto since modifications may be made by persons skilled in the art. The present application contemplates any and all modifications that fall within the spirit and scope of the underlying invention disclosed and to claimed herein.

What is claimed is:

1. A memory cell structure comprising:
    a semiconductor substrate;
    a trench formed in said semiconductor substrate;
    a first trench fill formed in said trench, including a first conductive region of at least first and second conductive materials, and functioning as a storage node electrode of the capacitor, said first conductive material being a first impurity-doped conductive material and said second conductive material being a material other than polysilicon;
    an insulating layer formed on the sidewall of said trench above said first trench fill;
    a second trench fill formed on said first conductive region and including a second conductive region;
    a third trench fill formed on said second conductive region and said insulating layer and including a third conductive region;
    a transistor having a source/drain region adjacent to an intersection of said trench and the surface of said semiconductor substrate; and
    a strap for electrically connecting said first and second conductive materials in said trench to said source/drain region.

2. The memory cell structure according to claim 1, wherein said material other than polysilicon is a material selected from the group consisting of WSi, TiSi, W, Ti, and TiN.

3. The memory cell structure according to claim 1, wherein said first conductive region is a stacked layer structure including a first layer of said first conductive material and a second layer of said second conductive material.

4. The memory cell structure according to claim 3, wherein said stacked layer structure further includes a third layer of said first conductive material.

5. The memory cell structure according to claim 1, wherein said third conductive region includes polysilicon.

6. The memory cell structure according to claim 1, wherein said second conductive region includes at least said first conductive material and a third conductive material, said third conductive material being a material other than polysilicon.

7. The memory cell structure according to claim 6, wherein said material in said second conductive and third conductive materials is selected from the group consisting of WSi, TiSi, W, Ti, and TiN.

8. The memory cell structure according to claim 7, wherein said second and third conductive materials are the same.

9. The memory cell structure according to claim 7, wherein said first conductive region is a stacked layer structure including a first layer of said first conductive material, a second layer of said second conductive material, and a third layer of said first conductive material, and wherein said second conductive region is a stacked layer structure including a first layer of said first conductive material, a second layer of said third conductive material, and a third layer of said first conductive material.

10. The memory cell structure according to claim 6, wherein said third conductive region includes at least said first conductive material and a fourth conductive material, said fourth conductive material being a material other than polysilicon.

11. The memory cell structure according to claim 10, wherein the material in said second, third, and fourth conductive materials is selected from the group consisting of WSi, TiSi, W, Ti, and TiN.

12. The memory cell structure according to claim 10, wherein said second and third conductive materials are the same and different from said fourth conductive material.

13. The memory cell structure according to claim 10, wherein said first conductive region is a stacked layer structure including a first layer of said first conductive material, a second layer of said second conductive material, and a third layer of said first conductive material, and wherein said second conductive region is a stacked layer structure including a first layer of said third conductive material and a second layer of said first conductive material, and wherein said third conductive region is a stacked layer structure including a first layer of said fourth conductive material and a second layer of said first conductive material.

14. A memory cell structure comprising:
    a semiconductor substrate;
    an insulating layer formed on top of said semiconductor substrate;
    first and second trenches formed in said semiconductor substrate and separated from each other by said insulating layer;
    a first trench fill formed in said first trench, including a first conductive region of at least first and second conductive materials, and functioning as a storage node electrode of the first capacitor, said first conductive material being a first impurity-doped conductive material and said second conductive material being a material other than polysilicon;

a second trench fill formed in said second trench, including a second conductive region of at least said first and second conductive materials, and functioning as a storage node electrode of the second capacitor;

a first transistor having a first source/drain region adjacent to an intersection of said first trench and said insulating layer;

a first strap for electrically connecting said first and second conductive materials in said first trench to said source/drain region;

a second transistor having a second source/drain region adjacent to an intersection of said second trench and said insulating layer; and a second strap for electrically connecting said first and second conductive materials in said second trench to said second source/drain region.

15. The memory cell structure according to claim 14, wherein said material other than polysilicon is a material selected from the group consisting of WSi, TiSi, W, Ti, and TiN.

16. The memory cell structure according to claim 14, wherein each of said first and second conductive regions is a stacked layer structure including a first layer of said first conductive material and a second layer of said second conductive material.

17. A memory cell structure comprising:

a semiconductor substrate;

a trench formed in said semiconductor substrate;

a first trench fill including a first conductive region of first and second conductive materials, said first conductive material being a first impurity-doped conductive material and said second conductive material being a material other than polysilicon;

an insulating layer formed on a sidewall of the portion of said trench above said first trench fill;

a second trench fill formed on said first conductive region and having a second conductive region, said second conductive region including at least said first conductive material and a third conductive material, said third conductive material being a material other than polysilicon;

a third trench fill formed on said second conductive region and said insulating layer and having a third conductive region, said third conductive region including at least said first conductive material and a fourth conductive material, said fourth conductive material being a material other than polysilicon;

a transistor having a source/drain region adjacent to an intersection of said trench and the surface of said semiconductor substrate; and a strap for electrically connecting said first and second conductive materials in said trench to said source/drain region.

18. The memory cell structure according to claim 17, wherein the material in said second, third and fourth conductive materials is selected from the group consisting of WSi, TiSi, W, Ti, and TiN.

19. The memory cell structure according to claim 17, wherein said second and third conductive materials are the same and different from said fourth conductive material.

20. The memory cell structure according to claim 17, wherein said first conductive region is a stacked layer structure including a first layer of said first conductive material, a second layer of said second conductive material, and a third layer of said first conductive material, and wherein said second conductive region is a stacked layer structure including a first layer of said third conductive material and a second layer of said first conductive material, and wherein said third conductive region is a stacked layer structure including a first layer of said fourth conductive material and a second layer of said first conductive material.

21. A memory cell structure comprising:

a semiconductor substrate;

a trench formed in the semiconductor substrate;

a first trench fill disposed in the trench and including a first conductive region of at least first and second conductive materials, the first conductive material being a first impurity-doped conductive material and the second conductive material being a material other than polysilicon, wherein the first trench fill functions as a storage node electrode of a capacitor;

a second trench fill formed on the first conductive region and having a second conductive region; and a third trench fill formed on the second conductive region and having a third conductive region.

22. The memory cell structure of claim 21 including an insulating layer formed on a sidewall of the portion of the trench above the first trench fill.

23. The memory cell structure of claim 21, wherein the second conductive region of said second trench fill includes at least the first conductive material and a third conductive material, the third conductive material being a material other than polysilicon, and the third conductive region of the third trench fill includes at least the first conductive material and a fourth conductive material, the fourth conductive material being a material other than polysilicon.

24. The memory cell structure of claim 23, wherein the material in the second, third, and fourth conductive materials is selected from the group consisting of WSi, TiSi, W, Ti, and TiN.

25. The memory cell structure of claim 21, wherein the first conductive region is a stacked layer structure including a first layer of the first conductive material, a second layer of the second conductive material, and a third layer of the first conductive material, and wherein the second conductive region is a stacked layer structure including a first layer of the third conductive material and a second layer of the first conductive material, and wherein the third conductive region is a stacked layer structure including a first layer of the fourth conductive material and a second layer of the first conductive material.

26. The memory cell structure according to claim 1, wherein said strap is a buried strap formed by outdiffusing impurities from at least one of said first, second and third conductive regions to said semiconductor substrate.

27. The memory cell structure according to claim 14, wherein said first strap is a first buried strap formed by outdiffusing impurities from said first conductive region to said semiconductor substrate, and said second strap is a second buried strap formed by outdiffusing impurities from said second conductive region to said semiconductor substrate.

28. The memory cell structure according to claim 17, wherein said strap is a buried strap formed by outdiffusing impurities from at least one of said first, second and third conductive regions to said semiconductor substrate.

* * * * *